US012775208B2

(12) United States Patent
Lee et al.

(10) Patent No.: US 12,775,208 B2
(45) Date of Patent: *Oct. 27, 2026

(54) PELLICLE ASSEMBLY AND METHOD OF MAKING SAME

(71) Applicant: Taiwan Semiconductor Manufacturing Company, Ltd., Hsinchu (TW)

(72) Inventors: Hsin-Chang Lee, Zhubei City (TW); Pei-Cheng Hsu, Taipei (TW); Ta-Cheng Lien, Cyonglin Township (TW); Li-Jui Chen, Hsinchu City (TW); Tsai-Sheng Gau, Hsinchu City (TW); Chin-Hsiang Lin, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 6 days.

This patent is subject to a terminal disclaimer.

(21) Appl. No.: 18/751,858

(22) Filed: Jun. 24, 2024

(65) Prior Publication Data

US 2024/0345472 A1 Oct. 17, 2024

Related U.S. Application Data

(63) Continuation of application No. 17/318,315, filed on May 12, 2021, now Pat. No. 12,050,399.

(51) Int. Cl.
*G03F 1/64* (2012.01)
*H10P 76/40* (2026.01)

(52) U.S. Cl.
CPC ............ *G03F 1/64* (2013.01); *H10P 76/4085* (2026.01)

(58) Field of Classification Search
None
See application file for complete search history.

(56) References Cited

U.S. PATENT DOCUMENTS 10,065,402 B2 9/2018 Kim et al.
2005/0045262 A1* 3/2005 Eschbach .................. G03F 1/64 156/60

(Continued)

FOREIGN PATENT DOCUMENTS

CN 108878259 A 11/2018
CN 111279260 A 6/2020

(Continued)

OTHER PUBLICATIONS

Chinese Office Action for Application No. 202110820401.1, Dated May 27, 2025.

*Primary Examiner* — Roberts P Culbert
(74) *Attorney, Agent, or Firm* — Lippes Mathias LLP

(57) ABSTRACT

A method for preparing a pellicle assembly includes reducing the thickness of one or more initial membrane(s) to obtain a pellicle membrane. The pellicle membrane is then affixed to a mounting frame to obtain the pellicle assembly. Compressive pressure can be applied to reduce the thickness of the initial membrane(s). Alternatively, the thickness can be reduced by stretching the initial membrane(s) to obtain an extended membrane. A mounting frame is then affixed to a portion of the extended membrane. The mounting frame and the portion of the extended membrane are then separated from the remainder of the extended membrane to obtain the pellicle assembly. The resulting pellicle assemblies include a pellicle membrane that is attached to a mounting frame. The pellicle membrane can be formed from nanotubes and has a combination of high transmittance, low deflection, and small pore size.

20 Claims, 10 Drawing Sheets

(56) References Cited

U.S. PATENT DOCUMENTS

| | | | |
|---|---|---|---|
| 2016/0355001 A1 | 12/2016 | Kim et al. | |
| 2017/0038675 A1 | 2/2017 | Ahn et al. | |
| 2018/0329291 A1* | 11/2018 | Timmermans | G03F 1/62 |

FOREIGN PATENT DOCUMENTS

| | | |
|---|---|---|
| TW | 200506544 A | 2/2005 |
| TW | 201530251 A | 8/2015 |

* cited by examiner

PELLICLE ASSEMBLY AND METHOD OF MAKING SAME

CROSS-REFERENCE TO RELATED APPLICATIONS

This application is a continuation of U.S. patent application Ser. No. 17/318,315, filed on May 12, 2021, now U.S. Pat. No. 12,050,399, which is incorporated by reference in its entirety.

BACKGROUND

A photolithographic patterning process uses a reticle (i.e. photomask) that includes a desired mask pattern. The reticle may be a reflective mask or a transmission mask. In the process, ultraviolet light is reflected off the surface of the reticle (for a reflective mask) or transmitted through the reticle (for a transmission mask) to transfer the pattern to a photoresist on a semiconductor wafer. The exposed portion of the photoresist is photochemically modified. After the exposure, the resist is developed to define openings in the resist, and one or more semiconductor processing steps (e.g. etching, epitaxial layer deposition, metallization, et cetera) are performed which operate on those areas of the wafer surface exposed by the openings in the resist. After this semiconductor processing, the resist is removed by a suitable resist stripper or the like.

The minimum feature size of the pattern is limited by the light wavelength. Deep ultraviolet (UV) lithography, for example using a wavelength of 193 nm or 248 nm in some standard deep UV platforms, typically employs transmission masks and provides a smaller minimum feature size than lithography at longer wavelengths. Extreme ultraviolet (EUV) light, which spans wavelengths from 124 nanometers (nm) down to 10 nm, is currently being used to provide even smaller minimum feature size. At shorter wavelengths, particle contaminants on the reticle can cause defects in the transferred pattern. Thus, a pellicle assembly (or simply pellicle) is used to protect the reticle from such particles. The pellicle assembly includes a pellicle membrane which is attached to a mounting frame. The mounting frame supports the pellicle membrane over the reticle. In this manner, any contaminating particles which land on the pellicle membrane are kept out of the focal plane of the reticle, thus reducing or preventing defects in the transferred pattern caused by the contaminating particles.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is a first diagram, FIG. 3B is a second diagram, and FIG. 3C is a third diagram.

FIG. 6A is a first diagram, FIG. 6B is a second diagram, and FIG. 6C is a third diagram.

FIG. 8A is a first diagram, FIG. 8B is a second diagram, FIG. 8C is a third diagram, and FIG. 8D is a fourth diagram.

FIG. 9A is a first diagram, FIG. 9B is a second diagram, FIG. 9C is a third diagram, and FIG. 9D is a fourth diagram.

DETAILED DESCRIPTION

Figure 1:
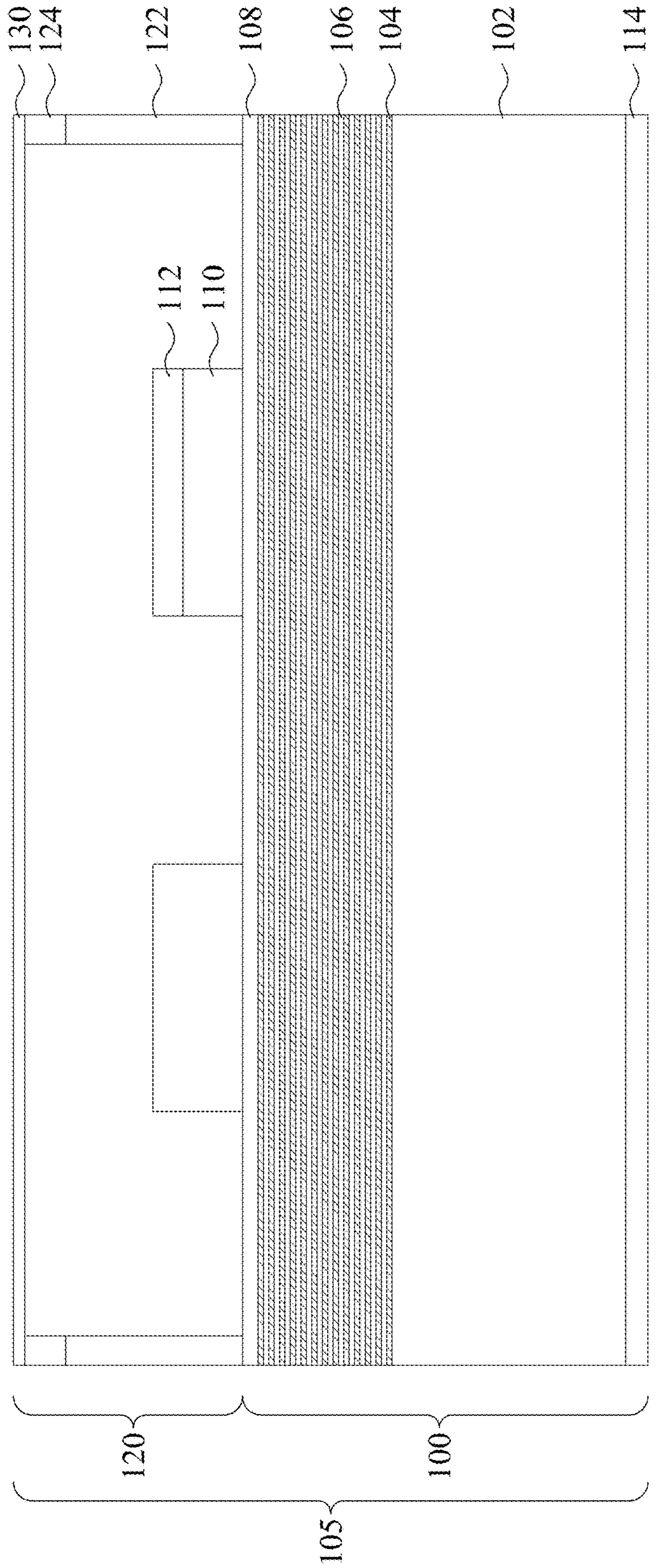
FIG. 1 is a cross-sectional view of an example reticle and pellicle assembly, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The present disclosure may refer to temperatures for certain method steps. It is noted that these references are usually to the temperature at which the heat source is set, and do not specifically refer to the temperature which must be attained by a particular material being exposed to the heat.

FIG. 1 illustrates a cross-sectional view of an example reticle assembly 105 useful in lithography, according to some embodiments. The reticle assembly 105 includes a reticle 100 and a pellicle assembly 120. The illustrative reticle 100 (also referred to in the art as a mask, photomask, or similar phraseology) is a reflective mask of a type commonly used in EUV lithography, and includes a substrate 102, alternating reflective layers 104 and spacing layers 106, a capping layer 108, an EUV absorbing layer 110 that is patterned to define a mask pattern, an anti-reflective coating (ARC) 112, and a conductive backside layer 114. The illustrative reticle 100 is merely a nonlimiting example. More generally, pellicles as disclosed herein can be used with substantially any type of reflective or transmission reticle. As another example (not shown), the reticle may be a transmission reticle, in which case the substrate is transmissive for light at the wavelength at which the lithography is performed. In general, the reflective or transmissive reticle includes a substrate (e.g. substrate 102) and a mask pattern (e.g. absorbing layer 110) disposed on the substrate. The pellicle assembly 120 includes a mounting frame 122, an adhesive layer 124, and a pellicle membrane 130. In some non-limiting illustrative embodiments, the reticle and pellicle assembly are intended for use with EUV light wavelengths, for example from 124 nm to 10 nm, including about 13.5 nm.

In embodiments, the substrate 102 is made from a low thermal expansion material (LTEM), such as quartz or titania silicate glasses available from Corning under the trademark ULE. This reduces or prevents warping of the reticle due to absorption of energy and consequent heating. The reflective layers 104 and the spacing layers 106 cooperate to form a Bragg reflector for reflecting EUV light. In some embodiments, the reflective layers may comprise molybdenum (Mo). In some embodiments, the spacing layers may comprise silicon (Si). The capping layer 108 is used to protect the reflector formed from the reflective layers and the spacing layers, for example from oxidation. In some embodiments, the capping layer comprises ruthenium (Ru). The EUV absorbing layer 110 absorbs EUV wavelengths, and is patterned with the desired pattern. In some embodiments, the EUV absorbing layer comprises tantalum boron nitride. The anti-reflective coating (ARC) 112 further reduces reflection from the EUV absorbing layer. In some embodiments, the anti-reflective coating comprises oxidized tantalum boron nitride. The conductive backside layer 114 permits mounting of the illustrative reticle on an electrostatic chuck and temperature regulation of the mounted substrate 102. In some embodiments, the conductive backside layer comprises chrome nitride.

The mounting frame 122 supports the pellicle membrane at a height sufficient to take the pellicle membrane 130 outside the focal plane of the lithography, e.g. several millimeters (mm) over the reticle in some nonlimiting illustrative embodiments. The mounting frame itself can be made from suitable materials such as anodized aluminum, stainless steel, plastic, silicon (Si), titanium, silicon dioxide, aluminum oxide ($Al_2O_3$), or titanium dioxide ($TiO_2$). Vent holes may be present in the mounting frame for equalizing pressure on both sides of the pellicle membrane.

The adhesive layer 124 is used to secure the pellicle membrane to the mounting frame. Suitable adhesives may include a silicon, acrylic, epoxy, thermoplastic elastomer rubber, acrylic polymer or copolymer, or combinations thereof. In some embodiments, the adhesive can have a crystalline and/or amorphous structure. In some embodiments, the adhesive can have a glass transition temperature (Tg) that is above a maximum operating temperature of the photolithography system, to prevent the adhesive from exceeding the Tg during operation of the system.

The pellicle membrane 130 is usually stretched over the mounting frame to obtain as uniform and flat a surface as possible. However, sagging of the pellicle membrane can occur, causing the membrane to deflect significantly from the desired flat and uniform orientation. This deflection can affect the light that is being reflected from the reticle and the resulting transferred pattern.

In addition, reticles (and their protective pellicle assembly) are maintained in reticle pods for safety and protection during lithographic patterning and other processes. Current EUV lithography systems typically use a dual-pod configuration consisting of an inner metal pod under vacuum and an outer pod with access to the ambient environment. The inner pod is only opened when the pod is inside the tool. Pressure differences, gravity, and other external forces can cause the pellicle membrane to deflect or sag. If the pellicle membrane sags far enough to contact the inner surface of the inner metal pod in which the reticle is kept, contamination of the pellicle membrane can occur, or the pellicle membrane itself might break.

The present disclosure thus relates to methods that are intended to reduce deflection of the pellicle membrane while maintaining high transmittance of EUV light and the particle-protecting ability of the pellicle membrane. Generally, one or more initial membranes is/are processed to obtain a pellicle membrane with a combination of high stiffness, high transmittance, and small pore size. For example, the initial membranes can be processed by uniaxial compression, or uniaxial stretching, or biaxial stretching. The processed pellicle membrane is then attached to a mounting frame to obtain a pellicle assembly suitable for protecting the reticle. The pellicle membranes of the present disclosure have a stiffness which minimizes potential deflection. The pellicle membranes may be appropriate for use with EUV light sources, as well as deep ultraviolet (DUV) light sources.

In some particular embodiments, the initial membrane(s) and the resulting pellicle membrane are formed from nanotubes. In some embodiments, the nanotubes can be carbon nanotubes (CNTs) or boron nitride nanotubes (BNNTs) or silicon carbide nanotubes (SiCNTs). In some embodiments, the nanotubes can be single-wall nanotubes or multi-wall nanotubes. It is possible for multi-wall nanotubes to be made of different materials, for example a CNT inside a BNNT, or vice versa. In some embodiments, the nanotubes can be metallic or semiconducting or electrically insulating. In some embodiments, the nanotubes can be randomly oriented or can be aligned in a desired orientation. The length and diameter of the individual nanotubes is not significant. The nanotubes can be made by known synthesis methods, such as arc discharge; laser vaporization of graphite; catalyzed chemical vapor deposition of hydrocarbons over a metal catalyst; ball milling and annealing of graphite powder; diffusion flame synthesis; electrolysis; low-temperature solid pyrolysis; floating catalyst CVD; or High Pressure Carbon Monoxide (HiPco) Process. Carbon nanotubes can have a Young's modulus of about 1.33 TPa; a maximum tensile strength of about 100 GPa; thermal conductivity of about 3000 to about 40,000 W/mK; and be stable up to a temperature of about 400° C. in air. Boron nitride nanotubes can have a Young's modulus of about 1.18 TPa; a maximum tensile strength of about 30 GPa; thermal conductivity of about 3000 W/mK; and be stable up to a temperature of about 800° C. in air.

An initial membrane(s) containing nanotubes, such as carbon nanotubes, can be formed using several different fabrication processes. For example, such fabrication processes can include chemical vapor deposition (CVD) such as floating catalyst CVD or plasma-enhanced CVD; electrophoretic deposition; dispersal in a solution and concentration by removal of the solvent; vacuum filtration; and the like.

In some other embodiments, the initial membrane(s) and the resulting pellicle membrane are formed from graphene or graphite. Graphite is made up of stacked graphene layers. In contrast to the nanotubes, graphene and graphite are in the shape of flat sheets. Graphene has a Young's modulus of approximately 1,000 GPa.

An initial membrane(s) can be formed from graphene or graphite using fabrication processes such as deposition/dispersion of relatively small graphene or graphite flakes or sheets on a surface to obtain a relatively large initial membrane. The smaller flakes or sheets can be arranged so that pores of a desired size are present between the smaller flakes/sheets. It is noted that this initial membrane can fall apart easily, since the individual flakes/sheets are not strongly bound to each other.

The initial membrane(s) and the resulting pellicle membrane generally should not include any other materials besides the nanotubes or graphene or graphite. For example, the membranes should not contain any moisture or any other binders, metals, plastics, surfactants, acids, or other compounds that might have been present in precursor materials or used in prior processing steps.

In some embodiments, the initial membrane prior to processing has a thickness of at least 0.7 micron (700 nm), and the processing operates to reduce the thickness to produce the pellicle membrane having a thickness of 200 nm or less. In some embodiments, the initial membrane(s) may each have a thickness ranging from about 1 micrometer (μm) to about 10 μm. In some embodiments, the resulting pellicle membrane has a thickness of from about 10 nanometers (nm) to about 100 nm. At higher thicknesses, mechanical properties may change in undesirable ways.

Because the pellicle membrane is in the optical path between the reticle and the wafer upon which the transferred pattern is to be imaged, certain optical properties are desired for the pellicle membrane. For example, the pellicle membrane should have high transmittance (i.e. optically transparent) for EUV wavelengths, low reflectivity for EUV wavelengths, low non-uniformity, and low scattering. During exposure and regular operations, the pellicle membrane will be exposed to high temperatures, and so certain thermal properties are also desirable. For example, the pellicle membrane should have low thermal expansion, high thermal conductivity, and high thermal emissivity. The pellicle membrane should also have good mechanical properties, such as high stiffness (i.e. low sagging or deflection) and stability. The pellicle membranes of the present disclosure have combinations of these desired properties. In particular, they have a combination of high transmittance and low sagging/deflection.

Figure 2:
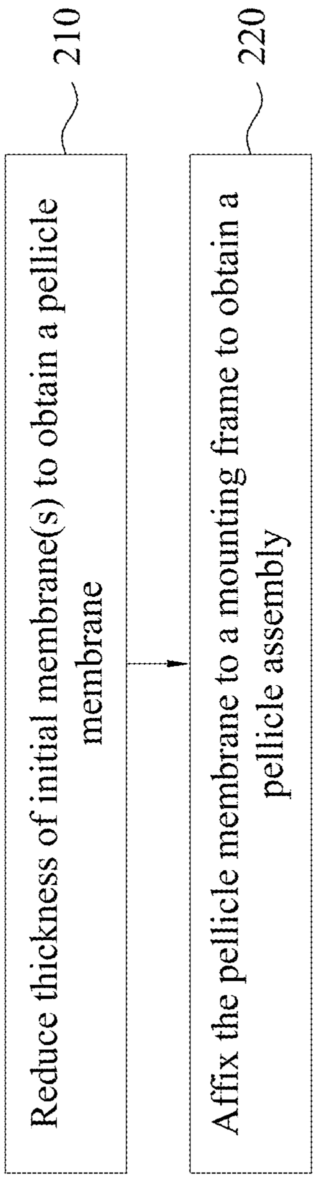
FIG. 2 is a flow chart illustrating a first embodiment of a method for preparing a pellicle assembly, in accordance with some embodiments.

FIG. 2 is a flow chart illustrating a first embodiment of a method for preparing a pellicle assembly. In step 210, one or more initial membranes are reduced in thickness to obtain a pellicle membrane. In some embodiments, the initial membrane(s) are uniaxially compressed. In various embodiments, any number of initial membranes can be compressed together to obtain the pellicle membrane. In some embodiments, the compressive pressure applied is from about 0.1 bar to about 20 bar (about 0.01 MPa to about 2 MPa). In some embodiments, the compressive pressure is applied for a time period of about 1 minute to about 60 minutes. The degree of pressure can change during this time period. For example, the force can be increased gradually to a given force and then maintained at that force level. In other embodiments, the initial membrane is stretched, either uniaxially or biaxially stretched. In step 220, the pellicle membrane is affixed to a mounting frame to obtain the pellicle assembly. This can be accomplished, for example, using a suitable adhesive.

Figures 3A, 3B, 3C:
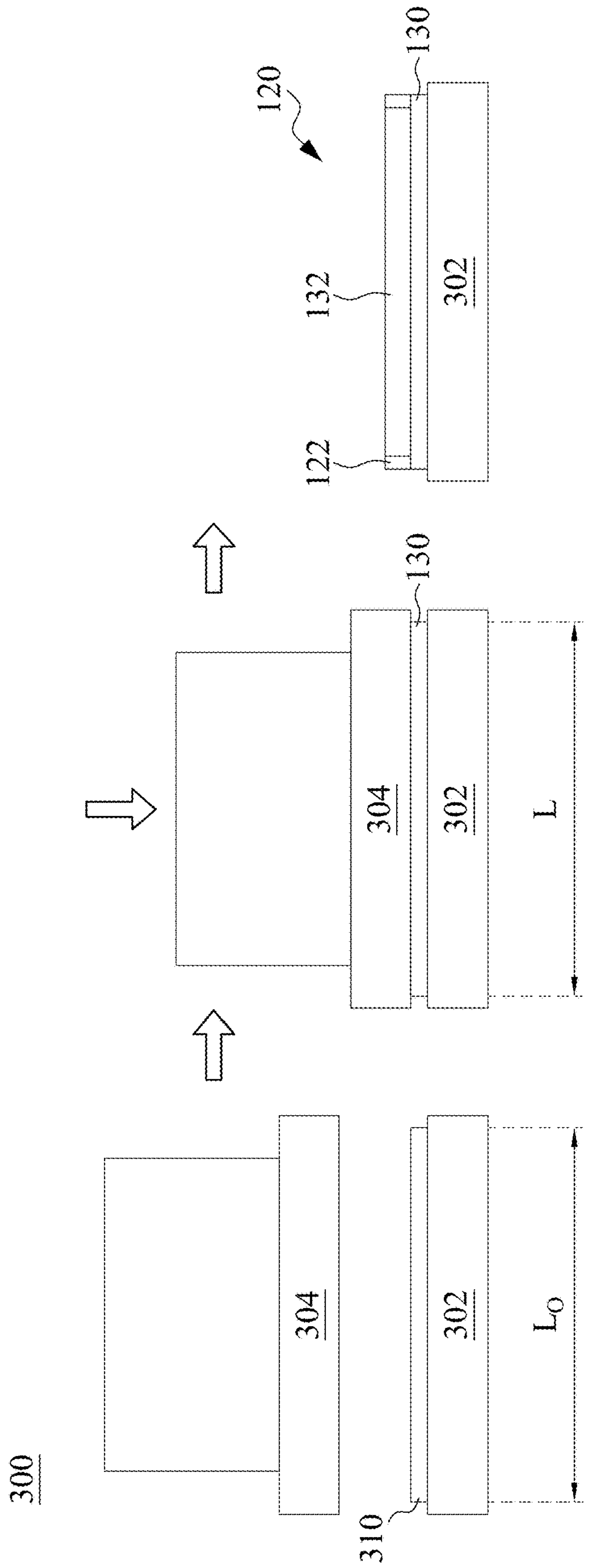
FIGS. 3A-3C are a set of diagrams illustrating the method of FIG. 2, in accordance with some embodiments.

FIGS. 3A-3C are a set of side views illustrating one method of FIG. 2, where the initial membrane is compressed by application of pressure. In FIG. 3A, one or more initial membranes is placed within a pressing machine 300. In some embodiments, the pressing machine is a hydraulic press. As illustrated here, one initial membrane 310 having an initial length $L_0$ is placed upon a bolster plate 302 and below the ram 304 of the press. In some embodiments, $L_0$ may be, for example from about 200 millimeters (mm) to about 500 mm.

In FIG. 3B, the initial membrane 310 is compressed between the bolster plate 302 and the ram 304. As a result, a pellicle membrane 130 is formed from the initial membrane. The pellicle membrane has a length L, which is greater than the initial length $L_0$. In some embodiments, L may be, for example from about 500 millimeters (mm) to about 1000 mm. The pellicle membrane also has a higher density than the initial membrane, and the pellicle membrane 130 is thinner than the initial membrane (i.e. reduced thickness). Without being bound by theory, it is believed that the deformation of the pellicle membrane introduced by the uniaxial compression is maintained after the compressive force is removed by van der Waals forces. In other words, the pellicle membrane does not return to its original thickness after the compressive force is removed. This applies whether the membrane is made of nanotubes, or graphene/graphite sheets.

In FIG. 3C, a mounting frame 122 is placed next to one surface 132 of the pellicle membrane. A slight force can then be applied, to affix the pellicle membrane 130 to the mounting frame 122 to obtain the pellicle assembly 120. This step does not use as much pressure as the compression step. In some embodiments, the pellicle membrane can be affixed using an adhesive previously applied to the mounting frame, or they may be joined together via van der Waals forces.

Figure 4:
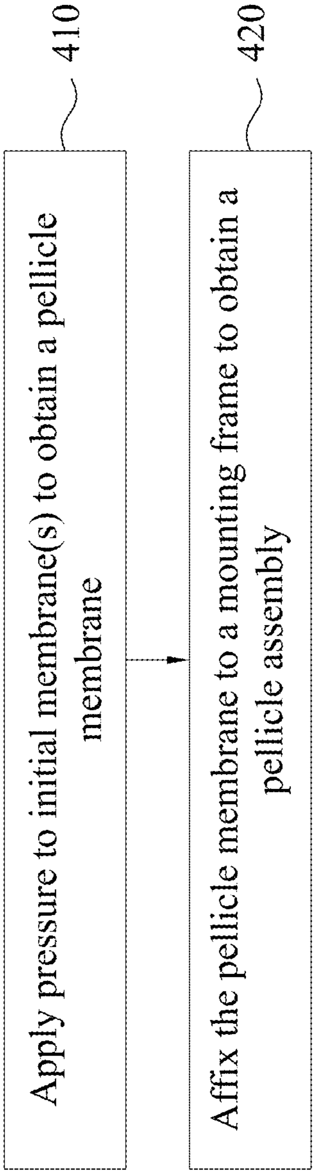
FIG. 4 is a flow chart illustrating a second embodiment of a method for preparing a pellicle assembly, in accordance with some embodiments.

FIG. 4 is a flow chart illustrating a second embodiment of a method for preparing a pellicle assembly. In step 410, one or more initial membranes is/are compressed by application of pressure to obtain a pellicle membrane. In addition, the initial membrane(s) is/are annealed during the compression. In some embodiments, the initial membrane(s) is/are annealed at a temperature of about 200° C. to about 500° C. This compression and annealing can take place in a vacuum environment or an ambient environment. It is believed that the annealing improves the mechanical properties of the membrane, increases its stiffness, and reduces microstructural defects that might be present. In step 420, the pellicle membrane is still affixed to a mounting frame to obtain the pellicle assembly. In some embodiments, the annealing is maintained during this mounting step. In other embodiments, annealing does not occur during this mounting step. The resulting pellicle assembly can then be attached to a reticle (that is, a reflective or transmissive mask including a substrate and a mask pattern disposed on the substrate) by securing the frame to the mask, with the pellicle membrane disposed over the mask pattern, to produce a final reticle with pellicle assembly, such as that shown in FIG. 1 by way of non-limiting illustrative example.

Figure 5:
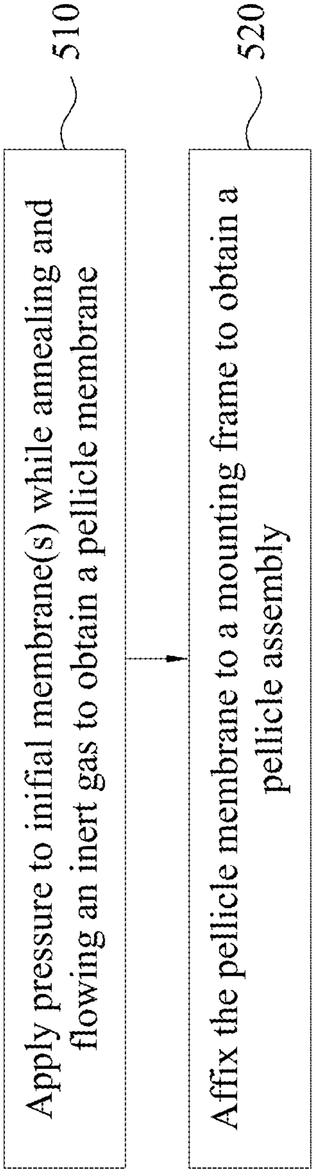
FIG. 5 is a flow chart illustrating a third embodiment of a method for preparing a pellicle assembly, in accordance with some embodiments.

FIG. 5 is a flow chart illustrating a third embodiment of a method for preparing a pellicle assembly. This third embodiment is similar to the method of FIG. 4, except that in step 510, the compression is performed along with the annealing while an inert gas is flowed past or through the initial membrane(s). The inert gas should not react with the material of the initial membrane(s). In some embodiments, the inert gas is pure nitrogen gas ($N_2$). The flow rate of the inert gas may range from about 2 standard cubic centimeters per minute (sccm) to about 20 sccm. The inert gas permits the annealing temperature to be increased, and/or to reduce the compression time. In some embodiments, the initial membrane(s) is/are annealed at a temperature of about 200° C. to about 800° C., or from about 500° C. to about 800° C. In step 520, the pellicle membrane is still affixed to a mounting frame to obtain the pellicle assembly. In some embodiments, the annealing and inert gas flow is maintained during this mounting step. In other embodiments, the annealing and inert gas flow is not applied during this mounting step.

Figures 6A, 6B, 6C:
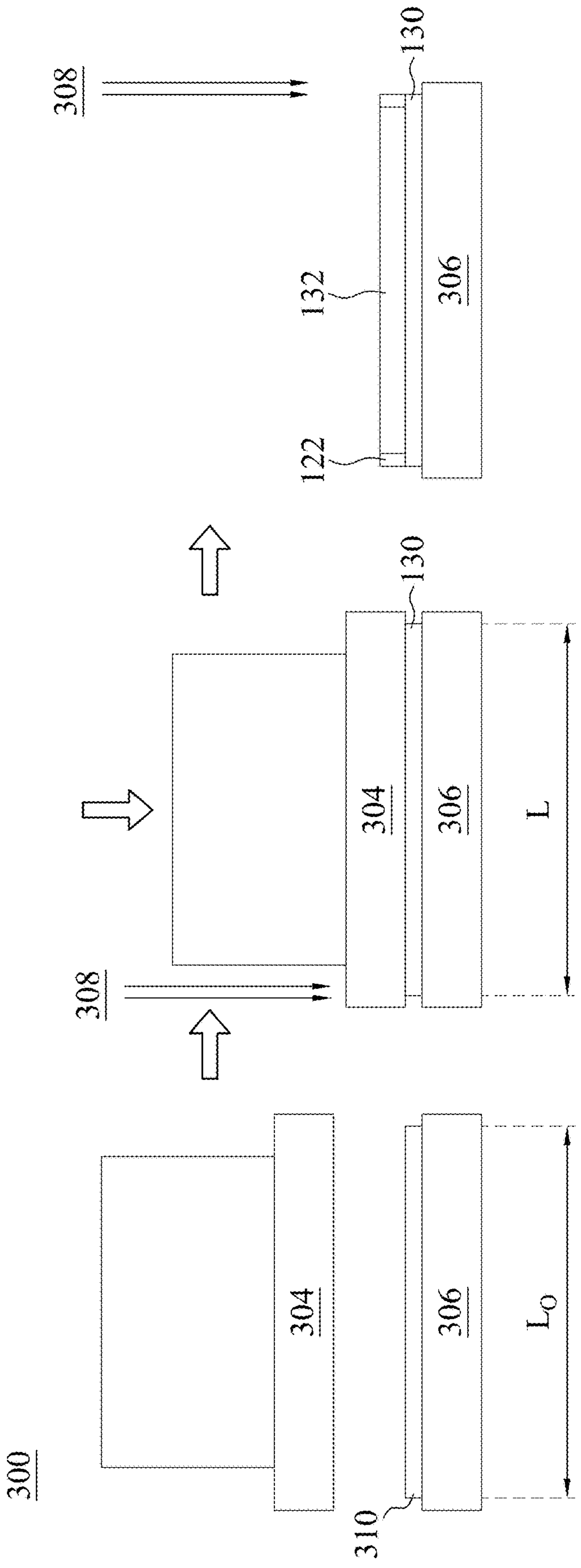
FIGS. 6A-6C are a set of diagrams illustrating the methods of FIGS. 4-5, in accordance with some embodiments.

FIGS. 6A-6C are a set of side views illustrating the methods of FIGS. 4-5. In FIG. 6A, one or more initial membranes is placed within a pressing machine. As illustrated here, one initial membrane 310 having an initial length $L_0$ is placed upon a heater plate 306 and below the ram 304 of the pressing machine.

In FIG. 6B, the initial membrane 310 is compressed between the heater plate 306 and the ram 304. If desired, the heater plate can be used to anneal the membrane(s) during compression. If desired, an inert gas 308 flows past/through the membrane(s). As a result, a pellicle membrane 130 is formed from the initial membrane. The pellicle membrane has a length L, which is greater than the initial length $L_0$, and also has a higher density than the initial membrane. In another embodiment, rather than using a heater plate, the chamber is heated, and the membrane(s) can be annealed via radiation.

In FIG. 6C, an adhesive is applied to a mounting frame 122, which is placed next to one surface 132 of the pellicle membrane, and slight force is applied to affix the pellicle membrane 130 to the mounting frame 122 to obtain the pellicle assembly. The annealing and/or inert gas flow 308 can be maintained during the mounting step if desired.

Figure 7:
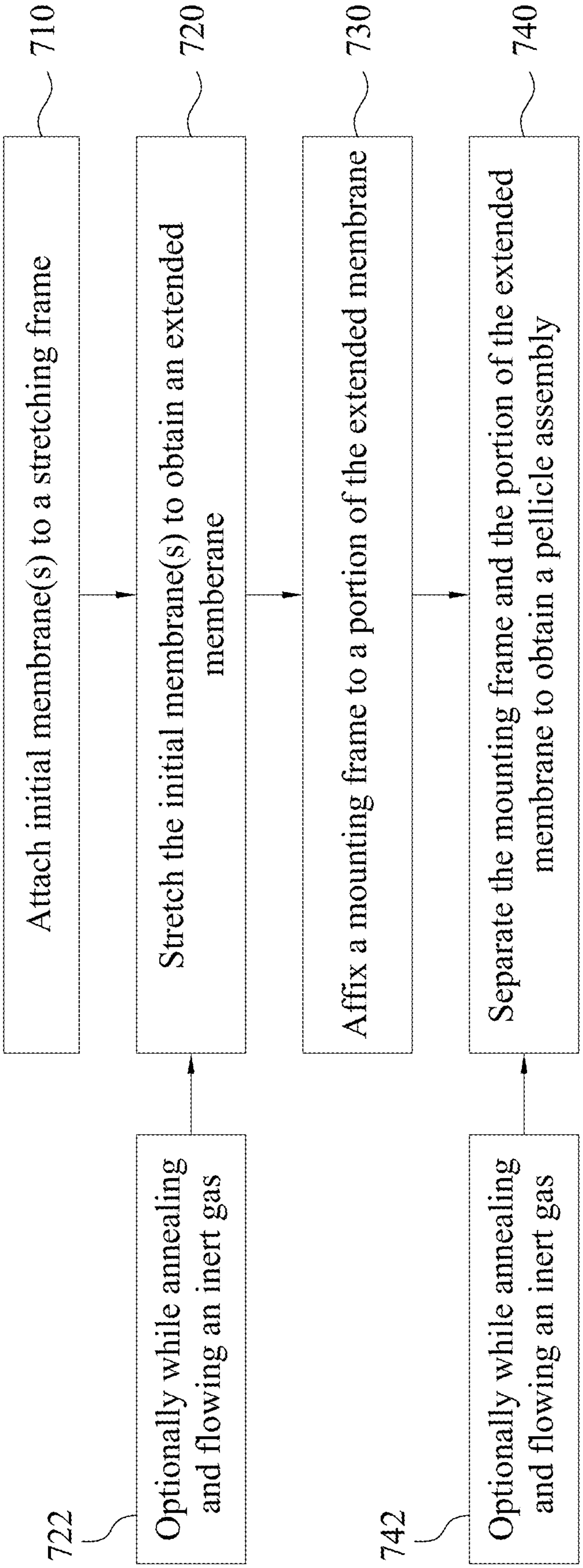
FIG. 7 is a flow chart illustrating a fourth embodiment of a method for preparing a pellicle assembly, in accordance with some embodiments.

FIG. 7 is a flow chart illustrating a fourth embodiment of a method for preparing a pellicle assembly. This method is applicable to membranes formed from nanotubes. In step 710, one or more initial membranes is/are attached to a stretching frame. In step 720, the initial membrane(s) is/are stretched to obtain an extended membrane. For example, the initial membrane(s) can be uniaxially stretched or biaxially stretched. In some embodiments, the initial membrane(s) is/are annealed during the stretching. The initial membrane(s) can be annealed at a temperature of about 200° C. to about 800° C. In other embodiments, the initial membrane(s) is/are heated at a temperature of about 200° C. to about 500° C. In some additional embodiments, the stretching is performed while an inert gas is flowed past or through the initial membrane(s). In some embodiments, the inert gas is pure nitrogen gas ($N_2$). These optional steps are indicated in step 722.

In step 730, a mounting frame is affixed to a portion of the extended membrane. The mounting frame has smaller dimensions (in length, or in width, or in both length and width) than the extended membrane, and thus surrounds a portion of the extended membrane. In step 740, the mounting frame and the portion of the extended membrane are then separated from the remainder of the extended membrane to obtain the pellicle assembly. This can be done, for example, by cutting or other similar means. If desired, the annealing and/or inert gas flow can be maintained during these affixing and separating steps (i.e. either one or both of the annealing and inert gas flow), as indicated in step 742. The portion of the extended membrane which is surrounded by the mounting frame can be considered the pellicle membrane. In this method, the initial membrane has a higher density than the final pellicle membrane. The final pellicle membrane is also thinner than the initial membrane(s). The resulting pellicle assembly can again then be attached to a reticle by securing the frame to the mask, with the pellicle membrane disposed over the mask pattern, to produce a final reticle with pellicle assembly, such as that shown in FIG. 1.

Figure 8A:
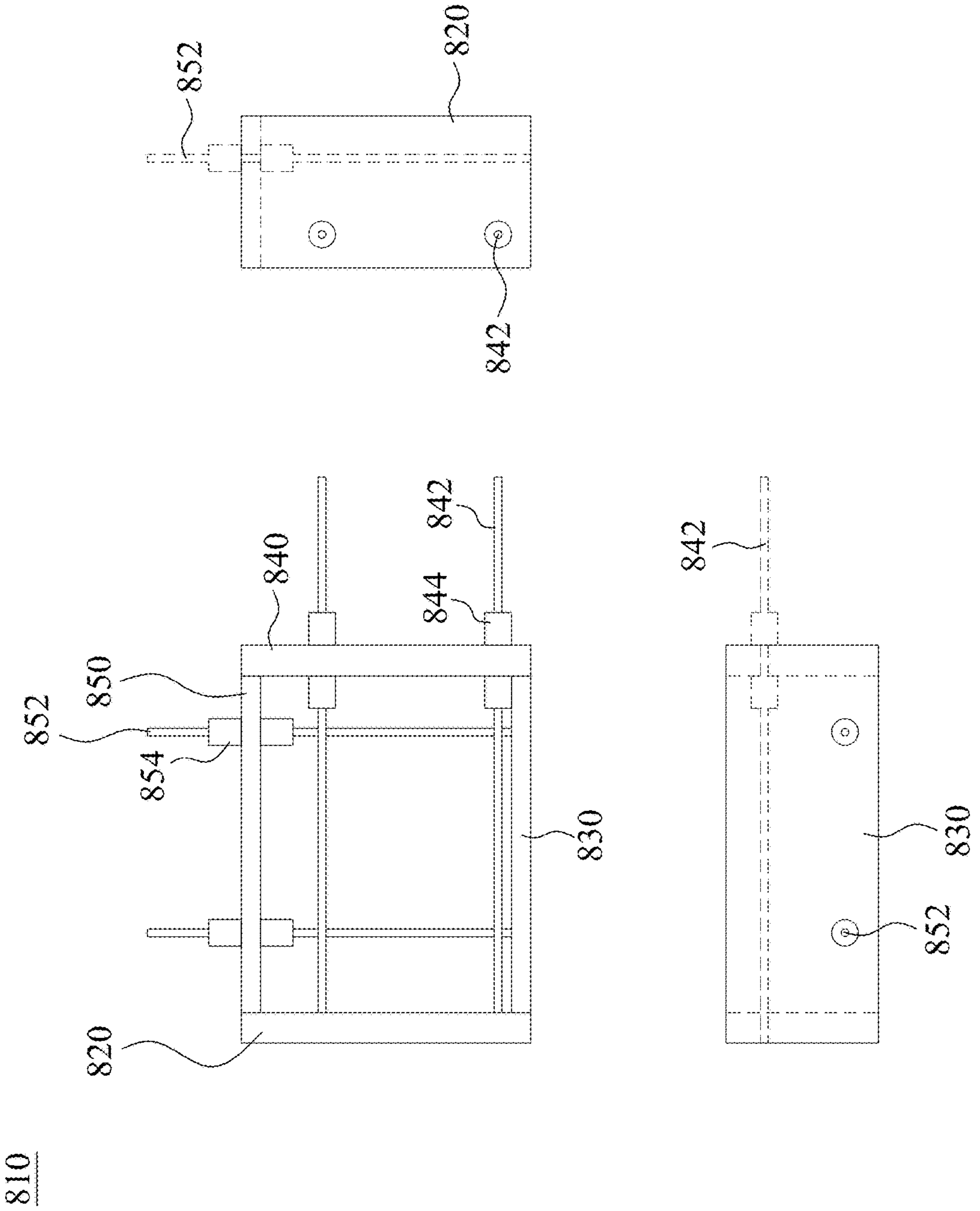
FIGS. 8A-8D is an illustration of one method for practicing the method of FIG. 7, in accordance with some embodiments.

FIGS. 8A-8D illustrate one embodiment of the method of FIG. 7. FIG. 8A shows a plan view, a length-side view, and a width-side view of the stretching frame without any membranes thereon. As illustrated here, the stretching frame 810 includes at least four side walls. Two adjacent side walls 820, 830 are fixed in place and can be made as one piece if desired. The other two side walls 840, 850 are mobile. As illustrated here, each mobile side wall is threaded upon two rods and fixed in place relative to each rod using nuts. For example, mobile side wall 840 is attached to rods 842 using nuts 844, and one end of each rod 842 is attached to opposite side wall 820. Similarly, mobile side wall 850 is attached to rods 852 using nuts 854, and one end of each rod 852 is attached to opposite side wall 830. As seen in the side views, rods 842 and rods 852 are on different planes along the height of the side walls.

Figure 8C:
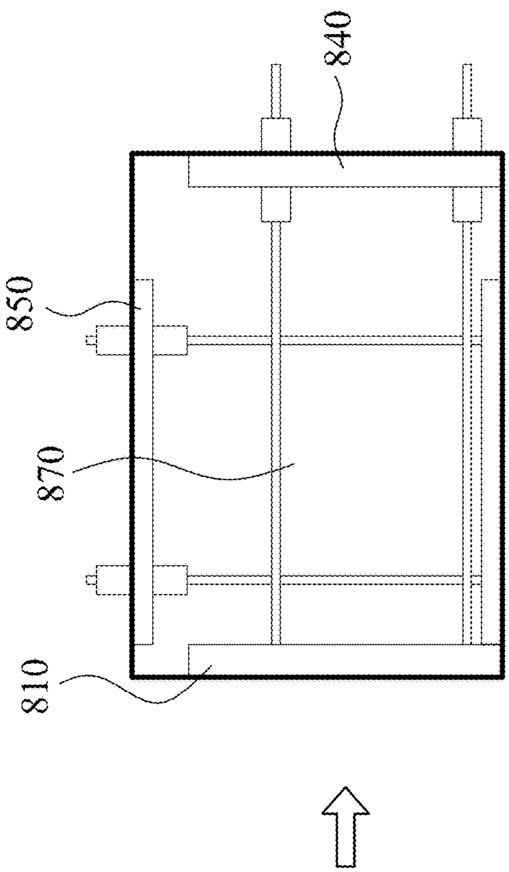
Figure 8B:
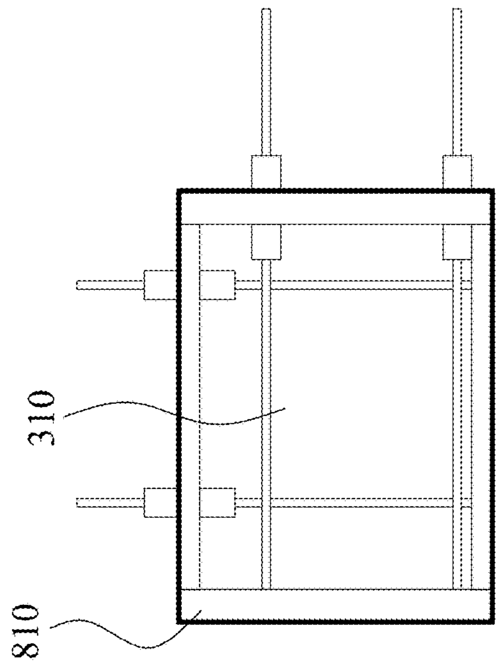

In FIG. 8B, one or more initial membranes 310 is/are attached to each side wall of the stretching frame 810. This can be accomplished, for example, using a suitable adhesive.

In FIG. 8C, the mobile side walls 840, 850 are extended along the X-axis and the Y-axis. As illustrated here, the mobile side walls 840, 850 are slid along the rods to a desired location, and the nuts are then tightened to hold them in place. This extension stretches the initial membrane(s) along two different axes, forming an extended membrane 870. The extended membrane 870 also has a lower density than the initial membrane 310, and the extended membrane 870 is thinner than the initial membrane 310.

Figure 8D:
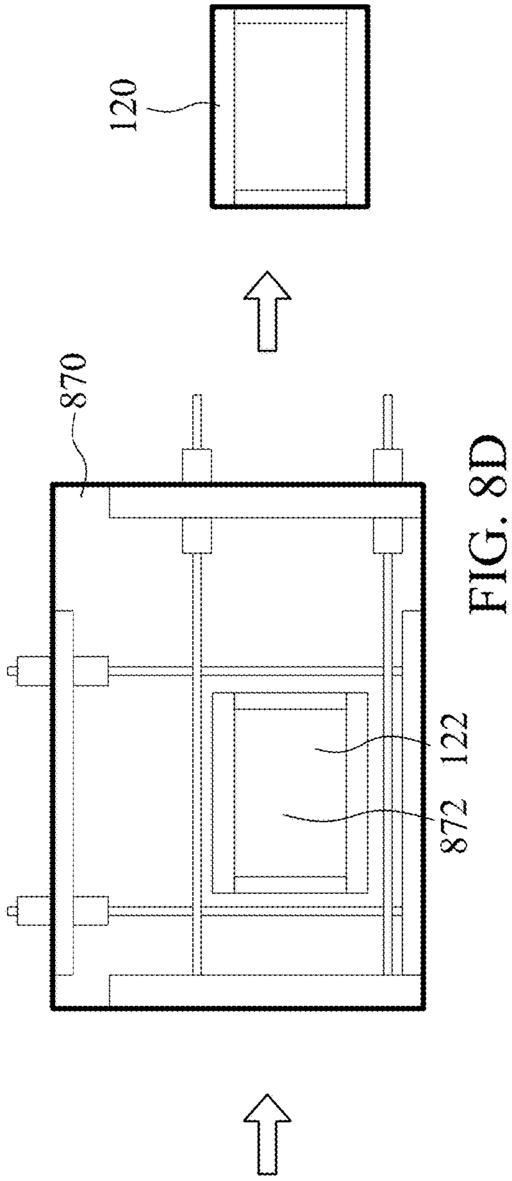

In FIG. 8D, a mounting frame 122 is affixed to a portion 872 of the extended membrane 870. The mounting frame 122 has fixed dimensions, and is attached to one side of the extended membrane 870. The mounting frame 122 and the portion 872 of the extended membrane are then cut out of the extended membrane, or separated from the remainder of the extended membrane, to obtain the pellicle assembly 120.

FIGS. 9A-9D illustrate another embodiment of the method of FIG. 7. The stretching frame differs from that of FIGS. 8A-8D.

Figure 9B:
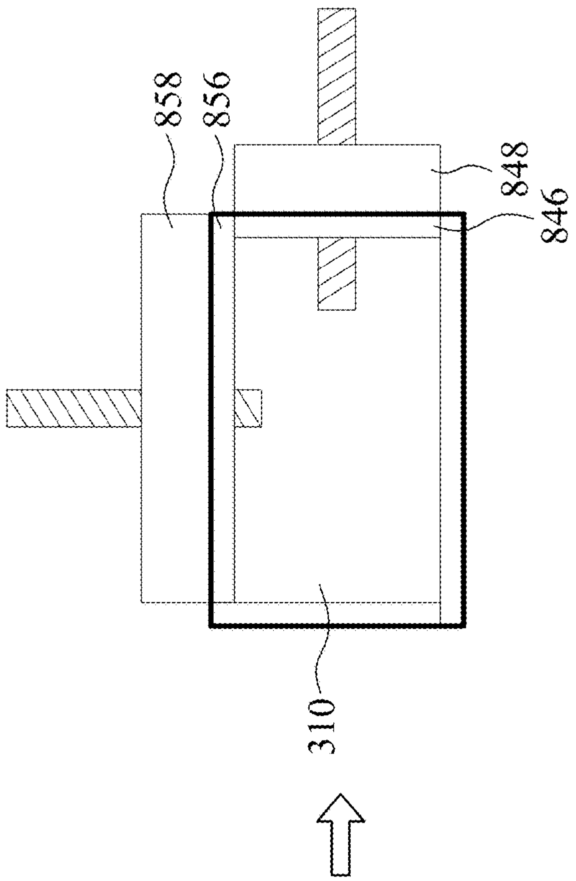
FIGS. 9A-9D is an illustration of another method for practicing the method of FIG. 7, in accordance with some embodiments.
Figure 9A:
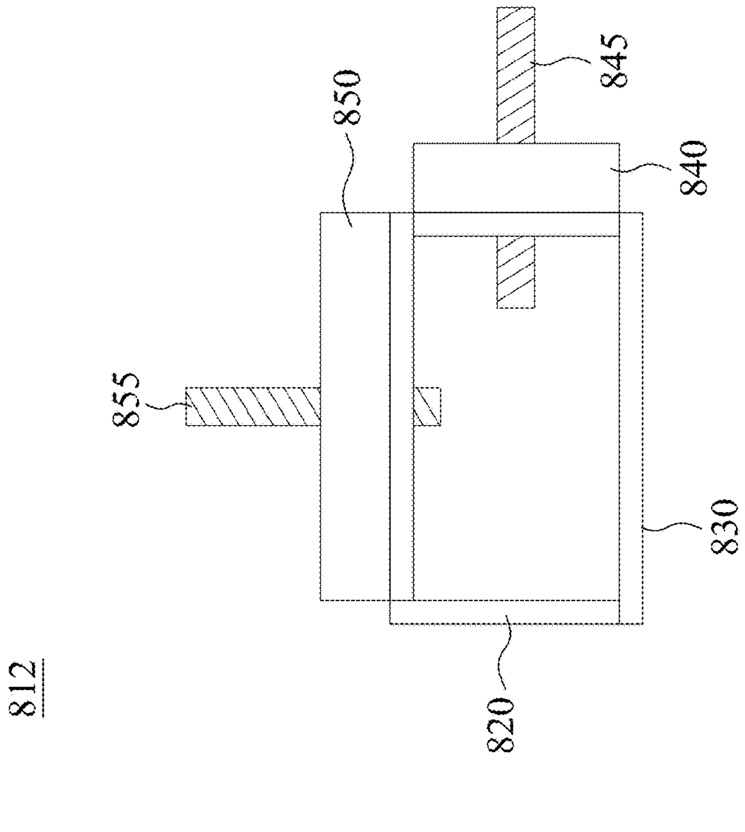

FIG. 9A illustrates the stretching frame 812 without any membranes thereon. Again, as illustrated here, the stretching frame 812 includes at least four side walls, two adjacent side walls 820, 830, and two mobile side walls 840, 850. However, each mobile side wall 840, 850 is threaded upon a driving screw 845, 855 respectively. The driving screw does not extend to the opposite side wall, but stays fixed in place relative to the opposite side wall. Because the driving screws 845, 855 do not extend to the opposite wall, they can be in the same plane as each other if desired.

In FIG. 9B, one or more initial membranes 310 is/are attached to each side wall of the stretching frame 812. As illustrated here, for example, this can be accomplished using adhesive and by trapping the sides of the membrane between two opposing grips 846, 848, 856, 858 that make up the side walls 840, 850.

Figure 9D:
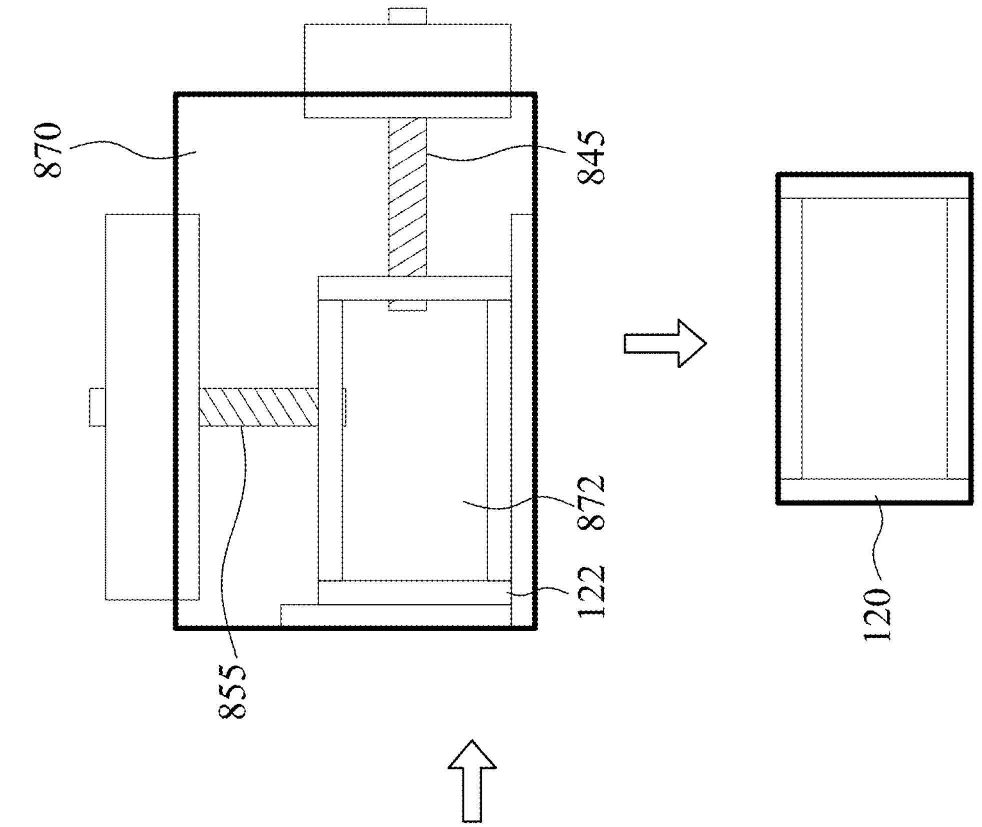
Figure 9C:
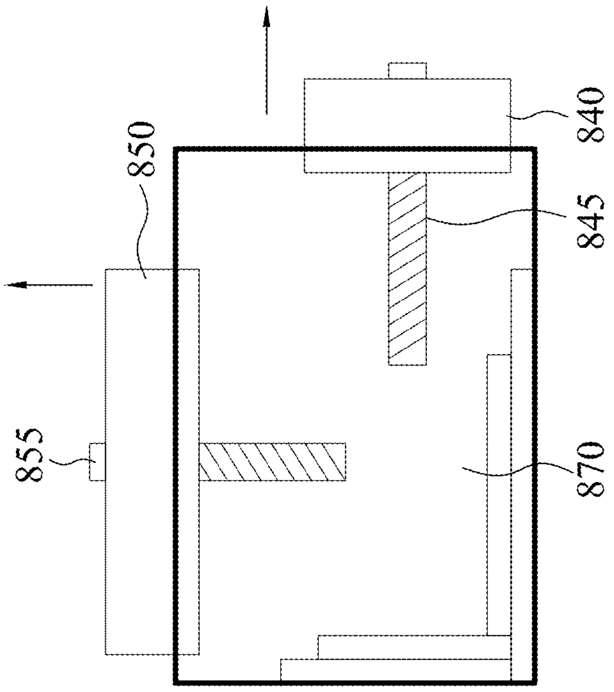

In FIG. 9C, the mobile side walls 840, 850 are extended along the X-axis and the Y-axis by rotation of the driving screws 845, 855. This extension stretches the initial membrane(s) biaxially, forming an extended membrane 870 having a density that is less than the density of the initial membrane(s). In some embodiments, the initial membrane(s) is/are only stretched uniaxially. This stretching also causes the extended membrane to have a thickness that is less than the thickness of the initial membrane(s).

In FIG. 9D, a mounting frame 122 is affixed to a portion 872 of the extended membrane 870. Again, the mounting frame 122 has fixed dimensions, and is attached to one side of the extended membrane 870. While illustrated here in a location that avoids the driving screws 845, 855, the mounting frame 122 can also be affixed in a location over the driving screws. In some particular embodiments, the mounting frame is affixed around a center of the extended membrane. The mounting frame 122 and the portion 872 of the extended membrane are then separated from the remainder of the extended membrane to obtain the pellicle assembly 120.

The methods described herein provide a pellicle membrane with an improved combination of EUV transmittance, pore size, and stiffness. The pellicle membranes of the present disclosure maintain high transmittance in the EUV wavelength range. This permits more light to reach the photomask for a given exposure energy and also reduces heat buildup in the pellicle membrane. In some embodiments, the pellicle membranes have a transmittance (T %), when measured at a EUV wavelength of 13.5 nm, of greater than 90%, or of greater than 95%, or of greater than 96%, or of greater than 97%.

One means by which the high transmittance is obtained is through the presence of pores in the pellicle membrane, since the pores do not reflect or absorb EUV wavelengths. The pellicle membranes of the present disclosure have an average pore size that is small enough to prevent particles from passing through the pellicle membrane and landing on the reticle/photomask. In some embodiments, the maximum pore size of the pores in the pellicle membranes is less than 30 nm in diameter. In this regard, a pore is considered to be any straight path that passes entirely through the pellicle membrane. Pores may be present due to spaces between nanotubes, or between the flakes/sheets of graphene or graphite. The pore size is the smallest diameter of this straight path (because a particle only has to be trapped before passing through the pellicle membrane, it does not have to be stopped at the outer surface of the pellicle membrane). The pore size can be measured using conventional methods, for example by imaging the membrane and measuring the size of each pore.

The increased stiffness of the pellicle membrane minimizes any potential sagging or deflection that may occur over time. For example, the dimensions of the pellicle membrane (length and width) are on the order of ~100 millimeters. The pellicle membranes of the present disclosure may sag or deflect in the range of 700 micrometers or less under an applied pressure differential of two pascals (Pa). In embodiments, the pellicle membrane may have a thickness ranging from about 10 nanometers (nm) to about 100 nm.

The pellicle membranes of the present disclosure also have low reflectivity for EUV wavelengths. Again, this permits more light to reach the photomask for a given exposure energy and also reduces critical dimension (CD) error. In some embodiments, the pellicle membranes have a reflectivity (R %), when measured at a EUV wavelength of 13.5 nm, of 5% or less, or of 3% or less, or of 2% or less, or of 1% or less, or of 0.5% or less.

The pellicle membranes of the present disclosure also have low non-uniformity at EUV wavelengths, or in other words have high uniformity. This reduces local CD error that can otherwise occur. In some embodiments, the pellicle membranes have a non-uniformity (U %), when measured at a EUV wavelength of 13.5 nm, of 1% or less, or of 0.5% or less, or of 0.3% or less, or of 0.1% or less.

Some embodiments of the present disclosure thus describe a pellicle assembly. The pellicle assembly includes a pellicle membrane that is attached to a mounting frame. The pellicle membrane has an EUV transmittance at 13.5 nm of at least 90%, a maximum deflection of 700 μm, and a maximum pore size of 30 nanometers. This combination of properties protects the photomask/mask pattern while maintaining high transmittance of EUV light and minimizes damage to the pellicle membrane during handling.

Other embodiments of the present disclosure relate to a reticle assembly comprising a reticle and a pellicle assembly, and a method of preparing such a reticle assembly. The reticle has a mask pattern thereon. The pellicle assembly is disposed over the mask pattern and secured to the reticle. The pellicle assembly comprises a pellicle membrane having at least a maximum deflection of 700 μm. In further embodiments, the pellicle membrane also has an EUV transmittance at 13.5 nm of at least 90%, and a maximum pore size of 30 nanometers.

Other embodiments of the present disclosure relate to a method of preparing a pellicle assembly. Generally, the thickness of an initial membrane is reduced to obtain a pellicle membrane (130). The pellicle membrane is then affixed to a mounting frame (122) to obtain the pellicle assembly. In some embodiments, compressive pressure is applied to the initial membrane(s) to obtain the pellicle membrane.

In other embodiments, the initial membrane(s) is/are stretched using a stretching frame to obtain an extended membrane. A mounting frame is then affixed to a portion of the extended membrane. The mounting frame and the portion of the extended membrane are then separated from the remainder of the extended membrane to obtain the pellicle assembly.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a pellicle assembly, comprising:

reducing a thickness of a membrane;

annealing the membrane while reducing the thickness of the membrane to obtain a pellicle membrane; and affixing the pellicle membrane to a mounting frame to obtain the pellicle assembly.

2. The method of claim 1, wherein the reducing of the thickness of the membrane comprises:

applying pressure to the membrane to obtain the pellicle membrane.

3. The method of claim 2, wherein the applied pressure is from about 0.01 MPa to about 2 MPa.

4. The method of claim 2, wherein the pressure is applied for a time period of about 1 minute to about 60 minutes.

5. The method of claim 1, wherein the reducing of the thickness of the membrane comprises stretching the membrane.

6. The method of claim 5, wherein the membrane is stretched using a stretching frame to obtain an extended membrane, and further comprising:

affixing a mounting frame to a portion of the extended membrane; and separating the mounting frame and the portion of the extended membrane from the remainder of the extended membrane, to obtain the pellicle assembly.

7. The method of claim 5, wherein the membrane is stretched biaxially.

8. The method of claim 1, wherein the annealing occurs in a vacuum environment or an ambient environment.

9. The method of claim 1, wherein the membrane is annealed at a temperature of about 200° C. to about 800° C.

10. The method of claim 1, further comprising flowing an inert gas past the initial membrane while reducing the thickness of the membrane.

11. The method of claim 10, wherein the inert gas is $N_2$.

12. The method of claim 10, wherein the inert gas is flowed at a rate of about 2 sccm to about 20 sccm.

13. The method of claim 1, wherein the membrane comprises nanotubes, graphene, or graphite.

14. The method of claim 1, wherein the pellicle membrane has a thickness of about 10 nanometers to about 100 nanometers.

15. A method for forming a reticle assembly, comprising:

disposing a pellicle assembly over a mask pattern on a reticle;

wherein the pellicle assembly is formed by:

reducing a thickness of a membrane;

annealing the membrane while reducing the thickness of the membrane to obtain a pellicle membrane; and affixing the pellicle membrane to a mounting frame to obtain the pellicle assembly.

16. The method of claim 15, wherein the pellicle membrane has an EUV transmittance at 13.5 nm of at least 90%, a maximum deflection of 700 μm, and a maximum pore size of 30 nanometers.

17. The method of claim 15, wherein the annealing occurs in a vacuum environment or an ambient environment.

18. The method of claim 15, wherein the membrane is annealed at a temperature of about 200° C. to about 800° C.

19. A method of forming a pellicle assembly, comprising:

applying pressure to or stretching a membrane to reduce its thickness and obtain a pellicle membrane;

annealing the membrane while reducing the thickness of the membrane to obtain the pellicle membrane; and affixing the pellicle membrane to a mounting frame to obtain the pellicle assembly.

20. The method of claim 19, wherein the membrane comprises nanotubes, graphene, or graphite.

* * * * *